United States Patent
Breen et al.

(10) Patent No.: US 6,864,504 B2
(45) Date of Patent: Mar. 8, 2005

(54) PLANAR POLYMER TRANSISTOR

(75) Inventors: Tricia L. Breen, Hopewell Junction, NY (US); Lawrence A. Clevenger, LaGrangeville, NY (US); Louis L. Hsu, Fishkill, NY (US); Li-Kong Wang, Montvale, NY (US); Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/453,381

(22) Filed: Jun. 3, 2003

(65) Prior Publication Data

US 2003/0222312 A1 Dec. 4, 2003

Related U.S. Application Data

(62) Division of application No. 10/052,151, filed on Jan. 15, 2002, now Pat. No. 6,620,657.

(51) Int. Cl.[7] .............................................. H01L 35/24
(52) U.S. Cl. ...................... 257/40; 438/642; 438/759
(58) Field of Search ..................... 438/99, 149, 479, 438/587, 623, 686, 725, 780; 257/40, 642, 759

(56) References Cited

U.S. PATENT DOCUMENTS

| | | | | |
|---|---|---|---|---|
| 4,041,204 A | * | 8/1977 | Hepher et al. | 430/253 |
| 4,847,732 A | * | 7/1989 | Stopper et al. | 361/739 |
| 5,017,989 A | * | 5/1991 | Street et al. | 257/291 |
| 5,625,199 A | * | 4/1997 | Baumbach et al. | 257/40 |
| 5,677,041 A | * | 10/1997 | Smayling | 257/66 |
| 5,739,193 A | * | 4/1998 | Walpita et al. | 524/413 |
| 5,804,836 A | * | 9/1998 | Heeger et al. | 257/40 |
| 5,936,259 A | * | 8/1999 | Katz et al. | 257/40 |
| 5,946,551 A | * | 8/1999 | Dimitrakopoulos et al. | 438/99 |
| 5,981,970 A | * | 11/1999 | Dimitrakopoulos et al. | 257/40 |
| 6,207,472 B1 | * | 3/2001 | Callegari et al. | 438/99 |
| 6,429,450 B1 | * | 8/2002 | Mutsaers et al. | 257/40 |
| 2002/0130828 A1 | * | 9/2002 | Yamazaki et al. | 345/80 |

OTHER PUBLICATIONS

Stanley Wolf and Richard N. Tauber, Silicon Processing for the VLSI Era, Lattice Press, vol. I, pg. 428.*

* cited by examiner

Primary Examiner—John F. Niebling
Assistant Examiner—Stanetta Isaac
(74) Attorney, Agent, or Firm—McGinn & Gibb, PLLC; Wan Yee Cheung, Esq.

(57) ABSTRACT

A structure and method of forming a fully planarized polymer thin-film transistor by using a first planar carrier to process a first portion of the device including gate, source, drain and body elements. Preferably, the thin-film transistor is made with all organic materials. The gate dielectric can be a high-k polymer to boost the device performance. Then, the partially-finished device structures are flipped upside-down and transferred to a second planar carrier. A layer of wax or photo-sensitive organic material is then applied, and can be used as the temporary glue. The device, including its body area, is then defined by an etching process. Contacts to the devices are formed by conductive material deposition and chemical-mechanical polish.

18 Claims, 6 Drawing Sheets

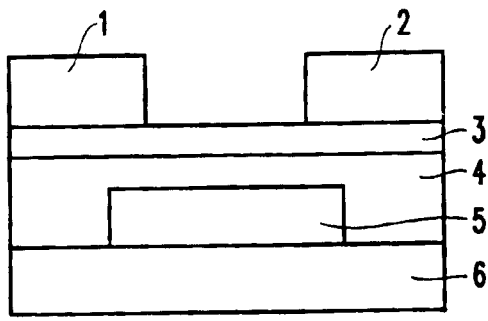
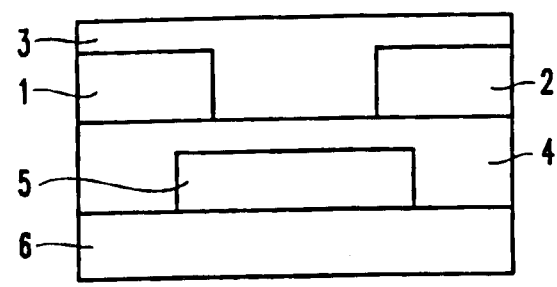
FIG.1 PRIOR ART
FIG.2 PRIOR ART
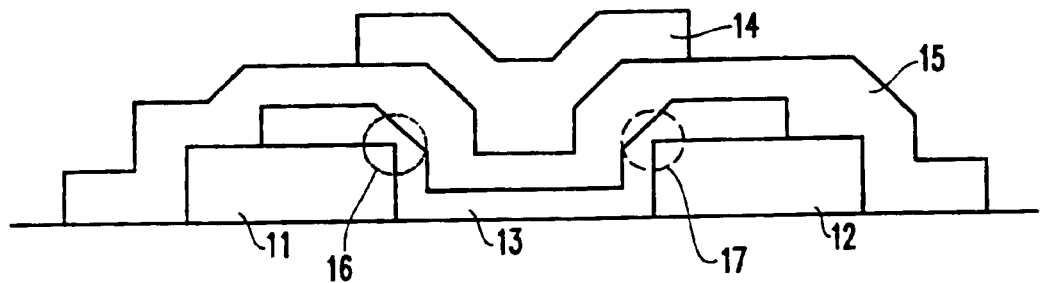
FIG.3A PRIOR ART
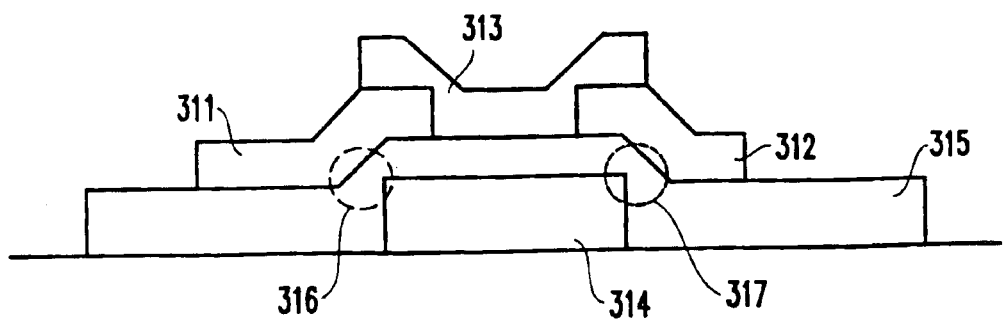
FIG.3B PRIOR ART

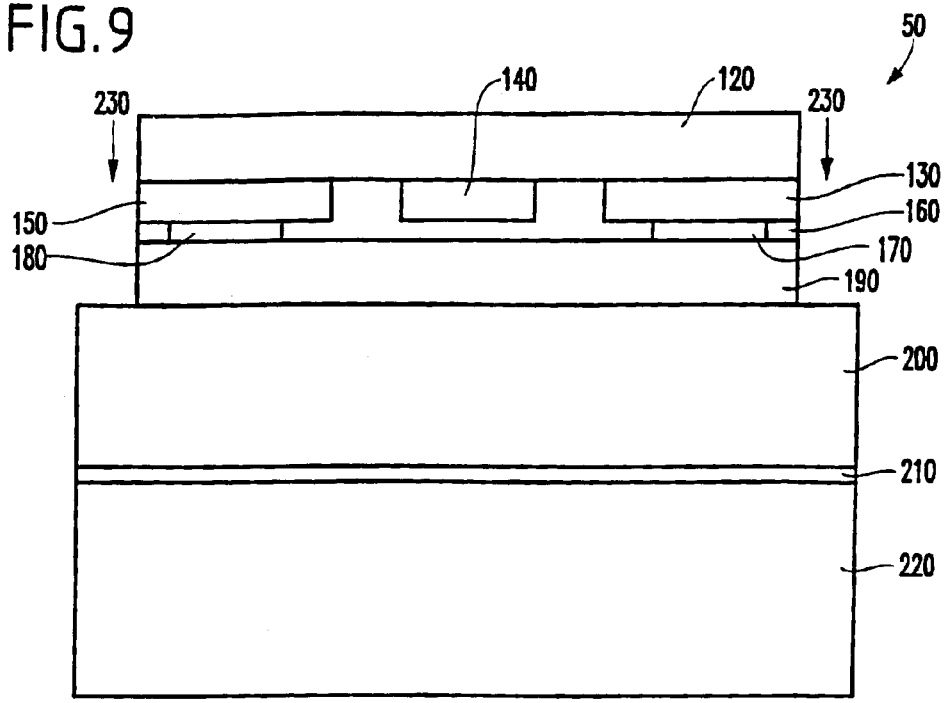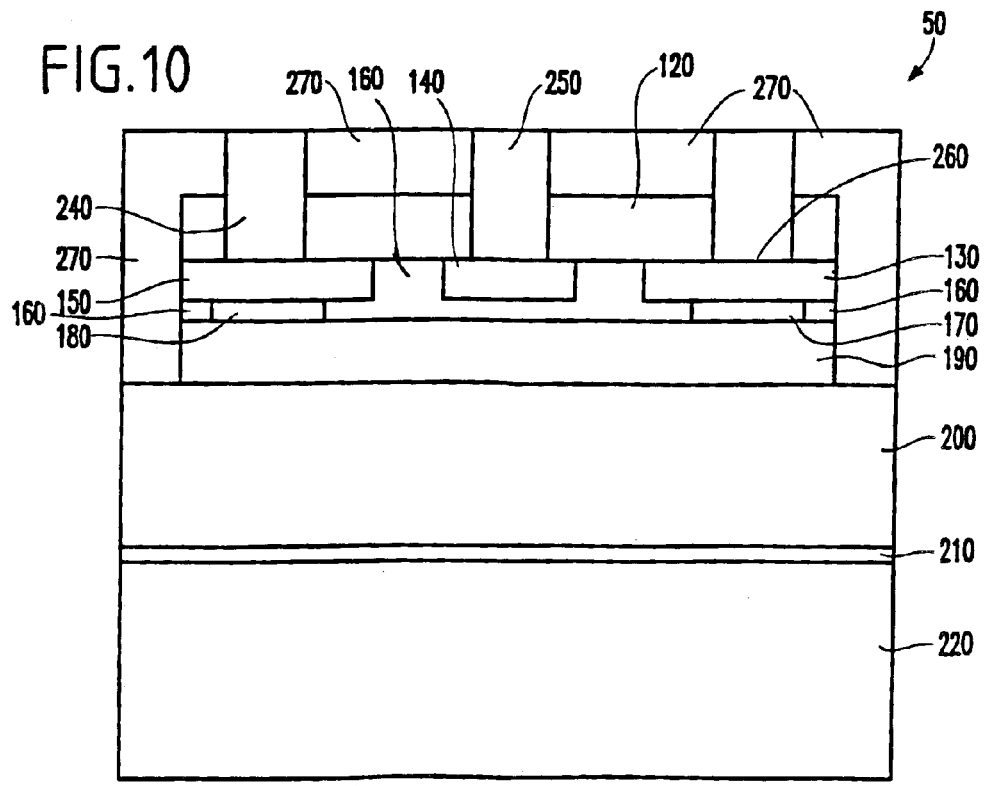

PLANAR POLYMER TRANSISTOR

CROSS-REFERENCE TO RELATED APPLICATION

This application is a division of U.S. application Ser. No. 10/052,151 filed Jan. 15, 2002 now U.S. Pat. No. 6,620,657.

BACKGROUND OF THE INVENTION

1. Field of the Invention

The present invention generally relates to semiconductor technology and device designs, and more particularly to an organic-based thin-film transistor device and a method for producing the same.

2. Description of the Related Art

Thin-film transistors (TFTs) with active organic layers and polymer-based electronic components are emerging as an inexpensive alternative to silicon-based TFTs for some applications. The use of organic and polymeric materials provides two main advantages: First, organic-based devices can be produced using a simpler and less expensive fabrication process in contrast to the expensive equipment and processing associated with silicon processing. Second, it is possible to fabricate the devices on flexible plastic substrates due to the ability to process organic materials at lower temperatures, and due to the greater mechanical flexibility of organic-based components relative to inorganic materials such as silicon and conductive metals. However, despite considerable research and development effort, organic-based TFTs have not yet reached commercialization, at least, in part, due to relatively poor device characteristics of prior art organic TFTs.

Fabrication of an all-organic TFT requires various organic or organic/inorganic hybrid materials: semiconductors, insulators, and conductors. The conductor may be selected from conducting polymers such as polyaniline and poly (ethylene dioxide thiophene), and metal or graphite colloid particle-based inks. There are a variety of polymeric organic insulators that may be used, such as polyimide or PMMA for the semiconductor. Organic p-type (hole transporting) and n-type (electron transporting) materials are both known in the art and have been tested as the semiconductive channel in TFTs. Two relatively simple device structures which have been used are the top contact and bottom contact, as shown in FIGS. 1 and 2, respectively. Generally, these devices comprise a source 1 and drain 2. In the top contact (FIG. 1), the source 1 and drain 2 are on top of an organic semiconductor 3, whereas in the bottom contact (FIG. 2), the source 1 and drain 2 are embedded in the organic semiconductor 3. Below the organic semiconductor 3 is an insulator 4 in both the top and bottom contact devices. Embedded within the insulator 4 is a gate 5. The entire device (both the top and bottom contact devices) is disposed on a substrate 6.

FET mobilities are generally assessed in the top-contact geometry because applying the electrode materials on top of the semiconductor layer ensures intimate contact. It is desirable to use the bottom-contact configuration for some applications, but in this geometry, the contact between the electrode and semiconductor may be limited to a fraction of the vertical wall area of the electrode. This results in increased contact resistance. Problems with bottom-contact devices are well-known to those skilled in the art. A method to improve the bottom-contact geometry is to planarize the source and drain electrodes, which increases the area of contact to the organic semiconductor. A planar substrate allows for improved semiconductor films deposited by spin-coating or printing. However, topography of the bottom source and drain contacts in the prior art causes problems with printing the organic semiconductor, which would be remedied by using a planar substrate.

As mentioned, organic p-type (hole transporting) and n-type (electron transporting) materials are known in the art and have been tested as the semiconducting channel in TFTs. P-type materials include conjugated polymers and linear, conjugated molecules. Examples of p-type conjugated polymers include derivatives of regioregular polythiophene described in Bao and Lovinger, "Soluble Regioregular Polythiophene Derivatives as Semiconducting Materials for Field-Effect Transistors," Chem. Mater., Vol. 11, pp. 2607–2612 (1999), the complete disclosure of which is herein incorporated by reference.

Examples of p-type conjugated molecules include pentacene, which has been extensively studied in TFTs, and further disclosed in U.S. Pat. Nos. 5,946,551; 5,981,970; and 6,207,472 B1; benzodithiophene dimers (Laquindanum et al., "Benzodithiophene Rings As Semiconductor Building Blocks," Adv. Mater., Vol. 9, pp. 36 (1997); phthalocyanines (Bao et al., "Organic Field-Effect Transistors with High Mobility Based On Copper Phthalocyanine," Appl. Phys. Lett., Vol. 69, pp. 3066–3068 (1996)); anthradithophenes (U.S. Pat. No. 5,936,259); and substituted and unsubstituted oligothiophenes, originally proposed in Gamier et al., in "Structural Basis For High Carrier Mobility In Conjugated Oligomers," Synth. Met., Vol.45, pp. 163 (1991); the complete disclosures of which are herein incorporated by reference.

There are comparatively fewer n-type organic semiconductors. Examples include 3,4,9,10-perylene tetracarboxylic dilmides described in Struijk et al., "Liquid Crystalline Perylene Dilmides: Architecture and Charge Carrier Mobilities," J. Am. Chem. Soc., Vol. 122, pp. 11057–11066 (2000); 1,4,5,8-naphthalene tetracarboxylic dianhydride (Laquindanum et al., "n-Channel Organic Transistor Materials Based on Naphthalene Frameworks," J. Am. Chem. Soc., Vol. 118, pp. 11331–11332(1996)); 1,4,5,8-naphthalenetetracarboxylic dumide derivatives (Katz et al., "Naphthalenetetracarboxylic Dilmide-Based n-Channel Transistor Semiconductors: Structural Variation and Thiol-Enhanced Gold Contacts," J. Am. Chem. Soc., Vol. 122, pp. 7787–7792 (2000)); and metallophthalocyanines substituted with various electron-withdrawing groups (Bao et al., "New Air-Stable n-Channel Organic Thin-film Transistors," J. Am. Chem. Soc., Vol. 120, pp.27–208 (1998); the complete disclosures of which are herein incorporated by reference.

In general, circuitry using organic transistors has the potential of reduced power consumption and simplicity in the design. However, complementary circuitry using both organic N and P channel transistors are not common, for example, U.S. Pat. No. 5,625,199, the complete disclosure of which is herein incorporated by reference, teaches a technique to fabricate complementary circuits with inorganic n-channel and organic p-channel thin-film transistors. Additionally, U.S. Pat. No. 5,936,259, the complete disclosure of which is herein incorporated by reference, describes a switch based on a thin-film transistor design (TFT) using a fused ring organic compound as a semiconductor. Furthermore, U.S. Pat. No. 5,804,836, the complete disclosure of which is herein incorporated by reference, describes an image processor design which operates on an array of polymer grid triodes. Similarly, prior art disclosures also teach a 5-stage ring oscillator using copper hexadecafluorophthalocyanide as the n-channel material and oligothiophenel oligothiophene derivative as the p-channel material.

Two popular structures of an existing polymer thin-film transistor are shown in FIGS. 3(a) and 3(b). These structures have two major disadvantages. First, the corner thinning problem due to topography, and second, the most sensitive portion of the body element is exposed to process-induced contamination. The resulting devices have poor performance and inconsistent properties. Shown in FIG. 3(a) is the first typical structure of the polymer transistor. The source 11 and drain 12 are first patterned. Then, the body material 13 is deposited and patterned. The body 13 is a semiconductive polymer or oligomer, and it is applied to the surface of the source 11 and drain 12 islands by evaporation, spin-coating, dip-coating or printing, depending on the organic semiconductor used. The body material 13 is patterned in one of three ways: the most common method is by evaporation of the semiconductive material through a shadow mask.

The other two methods are printing (i.e., screen printing or inkjet printing) and using conventional lithography by first applying a protective coating over the semiconductor, then applying the photoresist, patterning, and etching. A brief thermal anneal may be needed, depending on which type of organic semiconductor material is used. The last step includes applying a protective coating to the semiconductor to passivate the devices from contamination. After patterning the body portion 13, the substrate is wet cleaned. The body surface, especially in the channel region, deteriorates due to the unwanted chemical reaction. After a thermal treatment, the body element 13 becomes thin around the corners 16, 17 of the source 11 and drain 12 due to reflow. Typically, semiconductors decompose before melting. The source/drain 11, 12 to body contact area are significantly reduced as a result of the corner thinning 16, 17 of the body element 13. Then, the gate material 14 is deposited after a thin insulating polymer 15 is coated on top of the body element 13 and the exposed source 11 and drain 12 regions.

Another common structure of the polymer TFT structure is shown in FIG. 3(b). The gate 314 is formed first, then an insulating polymer 315 is coated thereon. Again, the corner thinning presented at the corners 316, 317 of the gate 314 causes the possibility of shorting of the source 311 and drain 312 to the gate 314. After the source 311 and drain 312 are formed, the body element 313 is formed. In this case, since the body to channel interface is not exposed to the chemical, the resulting transistor yield and performance are better than those of the first transistor.

In both of the bottom-contact devices described above, there is a well-documented problem with ensuring good contact between the electrodes and the organic semiconductor. One approach to solving this problem has been to modify the surface properties of gold electrodes using thin, self-assembled monolayers, which improves wetting of the electrode by the organic semiconductor and which may also decrease the chance of delaminating. However, the topography of the bottom electrodes may still hamper film formation and reduce the contact area. Therefore, there is a need for a new and improved structure and method for producing a planar polymer transistor which does not have the problems inherent with the prior art devices.

SUMMARY OF THE INVENTION

In view of the foregoing and other problems, disadvantages, and drawbacks of conventional thin-film transistor devices, the present invention has been devised, and it is an object of the present invention, to provide a structure and method for producing a planar polymer transistor which does not have the problems inherent with the prior art devices.

In order to attain the objects suggested above, there is provided, according to one aspect of the invention, a process of forming a fully-planarized polymer, thin-film transistor by using a first planar carrier to process a first portion of the device including a gate, source, drain and body elements. Preferably, the thin-film transistor is made with all organic materials. The gate dielectric can be a high-k polymer to boost the device performance. Then, the partially-finished device structures are flipped upside-down and transferred to a second planar carrier. A layer of wax or photo-sensitive organic material is then applied, and can be used as the temporary glue. The device, including its body area, is then defined by an etching process. Contacts to the devices are formed by conductive material deposition and chemical-mechanical polish. Unlike the conventional polymer thin-film transistor, the invention produces fully planarized devices so that there is no corner thinning problem. Another advantage of the new polymer device is that the most sensitive area of the device, the body, which is made of an organic semiconductor, is fully protected before any of the processing steps to avoid the possibility of being contaminated by the environment.

Specifically, a thin-film transistor device and a method of forming the same is disclosed which comprises forming a first substrate, depositing a first insulating layer on the first substrate, patterning a conductive layer on the first insulating layer, forming a composite over the conductive layer, depositing a semiconductive layer on the composite, protecting the semiconductive layer with a second insulating layer, applying a thermal treatment to the device, depositing a second substrate on the second insulating layer, inverting the device, removing the first substrate, bonding the second substrate to a first carrier layer, etching the composite, depositing a third insulating layer on the first insulating layer, and forming contacts through the first insulating layer and the third insulating layer.

The method further comprises forming the first substrate in a process comprising depositing a second adhesive layer on a first carrier layer and depositing the first insulating layer on the first adhesive layer. Moreover, the step of forming a composite comprises depositing a fourth insulating layer on the conductive layer, wherein the fourth insulating layer comprises a higher dielectric constant material than the first and second insulating layers.

The method further comprises coating the second substrate with a second adhesive layer prior to the step of bonding the second substrate to the second carrier layer. Moreover, the semiconductive layer comprises a fully planarized layer. Additionally, the first insulating layer comprises one of a polyester and a polyimide material. Also, the first insulating layer may comprise a polycarbonate material. Furthermore, the first and second adhesive layers are one of a photoresist and a photosensitive polyimide.

The novel features of the present invention are several. Broadly, the present invention provides for a high-performance transistor due to unique structural and process flow. Specifically, all functional components are preferably made of polymeric materials (semiconductive, conductive, low-k insulative, and high-k insulative materials). Furthermore, the carrier is preferably a wafer, glass carrier, or polymer, and can be rigid or flexible. However, the size is not limited by the wafer size and is adaptable to large format carriers. Also, the entire structure, including the semiconductor body, gate, source/drain, the interface between the body and the gate, and the drain/source are all fully planarized so that there is no electrical performance degradation due to the corner thinning between the semiconductor body and the source/drain region. Moreover, the structure is fabricated in a simple and cost-effective manner which allows for the fabrication of both N-FET and P-FET transistors. Finally, the semiconductor body is planarized and its interface with the source/drain and gate dielectric is fully protected from subsequent processing.

BRIEF DESCRIPTION OF THE DRAWINGS

The foregoing and other objects, aspects and advantages will be better understood from the following detailed description of a preferred embodiment(s) of the invention with reference to the drawings, in which:

FIG. 1 is a side view schematic diagram of a conventional transistor device;

FIG. 2 is a side view schematic diagram of a conventional transistor device;

FIG. 3(a) is a side view schematic diagram of a conventional transistor device;

FIG. 3(b) is a side view schematic diagram of a conventional transistor device;

FIG. 9 is a side view schematic diagram of a thin-film transistor device according to the present invention;

FIG. 10 is a side view schematic diagram of a thin-film transistor device according to the present invention.

DETAILED DESCRIPTION OF PREFERRED EMBODIMENTS OF THE INVENTION

As mentioned above, there is a need for an improved structure and method for producing a planar polymer transistor which does not have the problems-inherent with the prior art devices, such as the corner thinning problem due to topography, and having the most sensitive portion of the body element exposed to process-induced contamination. According to the present invention, a new and improved structure of a thin-film transistor is disclosed, as well as a method for producing the same.

Figure 4:
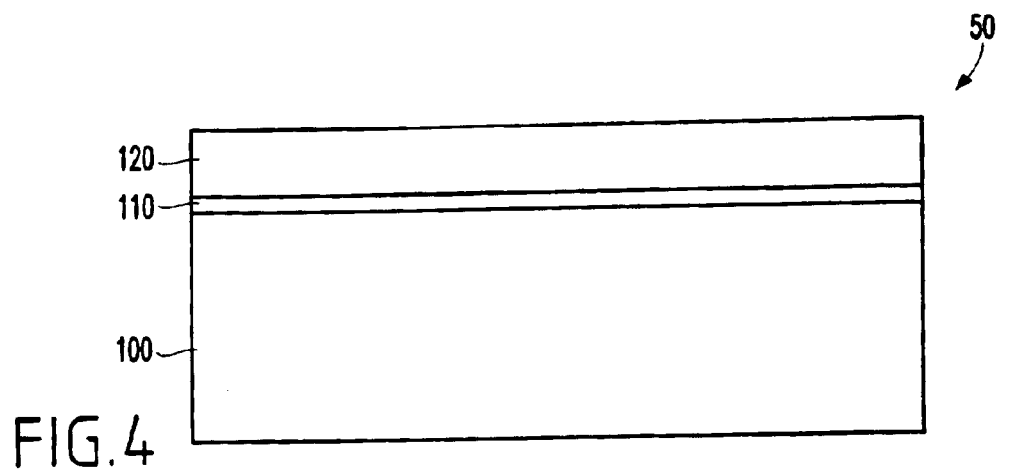
FIG. 4 is a side view schematic diagram of a partially completed thin-film transistor device according to the present invention.

Referring now to the drawings, and more particularly to FIGS. 4 through 11, there are shown preferred embodiments of the method and structures according to the present invention. Specifically, FIG. 4 shows a partially completed thin-film transistor device 50 comprising an insulating polymer 120 coated on top of a thin layer of wax 110 formed on a substrate carrier 100. The thin layer of wax 110 allows for the ease of material transference at a later stage. The substrate 100 can be glass, ceramic, or a semiconductor wafer. Polymer 120 can be a flexible substrate such as a polyester or a polyimide, or it can be a stiffer material such as polycarbonate.

Layer 110 can also be a photoresist or photosensitive polyimide wherein the solubility in solvents significantly increase upon exposure to light for the ease of detachment. Alternatively, the layer 110 can be a thin layer of polyimide which can be photoablated with a low power excimer laser.

Figure 5A:
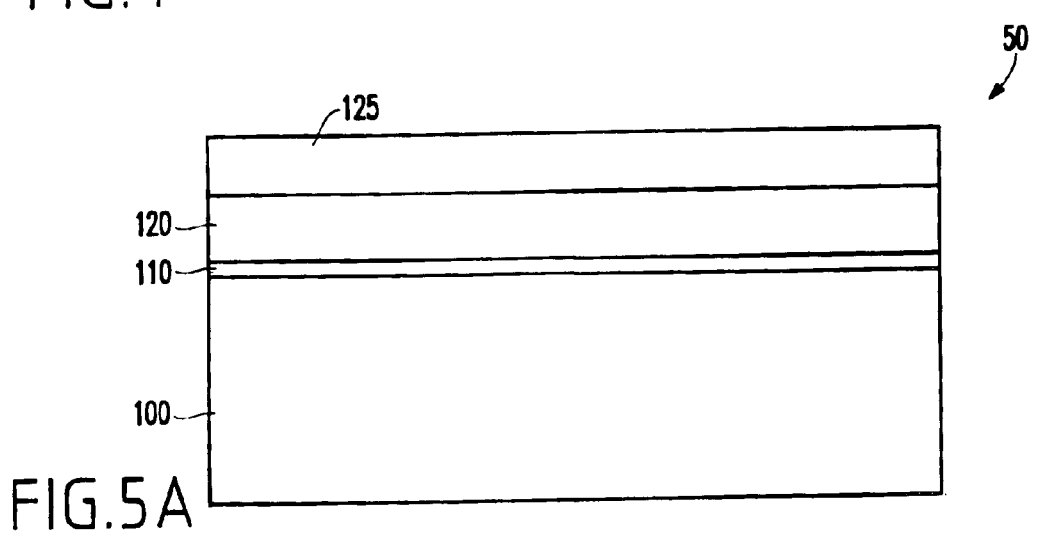
FIG. 5(a) is a side view schematic diagram of a partially completed thin-film transistor device according to the present invention.
Figure 5B:
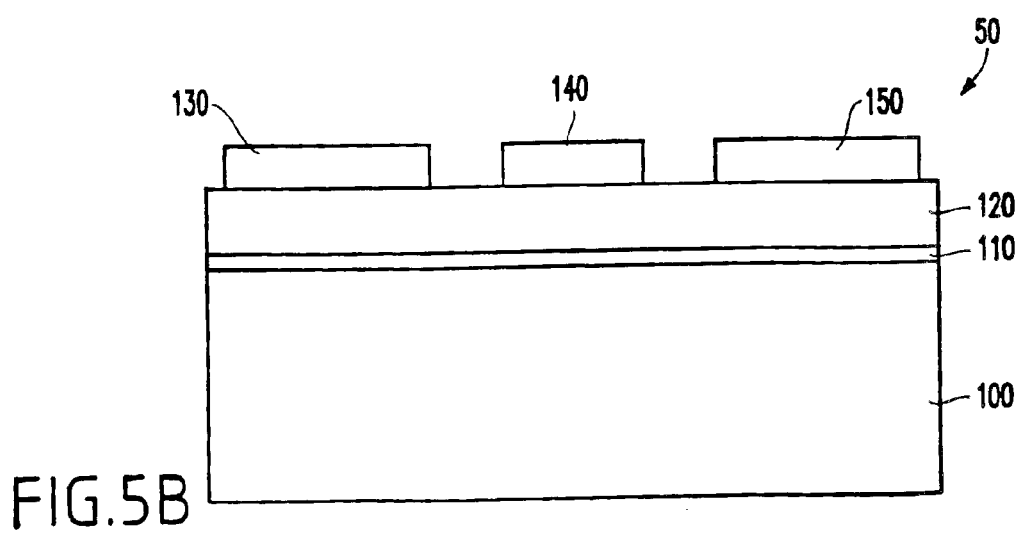
FIG. 5(b) is a side view schematic diagram of a partially completed thin-film transistor device according to the present invention.

A layer of conductive polymer 125, such as polyaniline, poly(pyrrole), poly(ethylene dioxide thiophene), or a conductive paste such as metal or graphite colloidal inks, or a conductive metal such as Au, Pd, Al, Cu, is then deposited on top of the insulating polymer 120, as shown in FIG. 5(a). The conductive polymer 125 can be patterned by using a conventional lithographic patterning method or a printing method which results in pads 130, 140 and 150, which is shown in FIG. 5(b). Pads 130,140 and 150 can be used as the source, gate, and drain conductors, respectively. The spaces between the pads are well-controlled so as to avoid forming any topography, and the method to do this is well-known in the art.

The conductive material 125 can also be formed by any number of printing methods, such as inkjet printing, which has been described in Sirringhaus et al., "High-Resolution Inkjet Printing of All-Polymer Transistor Circuits," Science, Vol. 290, pp. 2123–2126 (2000); screen printing as described in Bao et al., "High-Performance Plastic Transistors Fabricated by Printing Techniques," Chem. Mater., Vol. 9, pp. 1299–1301(1997); and the soft-lithographic technique micromolding in capillaries as described in Bao et al., "Printable Organic and Polymeric Semiconducting Materials and Devices," J. Mater. Chem., Vol. 9, pp. 1895–1904 (1999); the complete disclosures of which are herein incorporated by reference.

Figure 6:
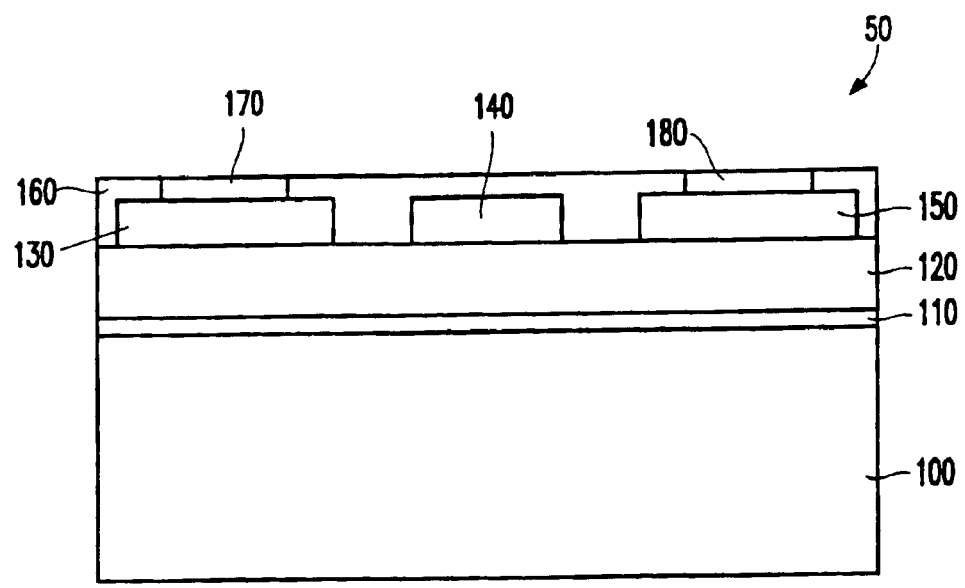
FIG. 6 is a side view schematic diagram of a partially completed thin-film transistor device according to the present invention.

As shown in FIG. 6, a second layer of insulating polymer 160 is coated on top of pads 130, 140, and 150, and within the spaces therein. This polymer 160 is preferably a high dielectric constant polymer. Some examples of high dielectric constant polymer composites are indicated in "High Dielectric Constant Ceramic Powder Polymer Composites," B. Y. Cheng et al., Appl. Phys. Lett. (USA), Vol. 76, No. 25, 19, Jun. 2000, P3804-6, and U.S. Pat. No. 5,739,193, the complete disclosures of which are herein incorporated by reference. For example, a ferroelectric polymer can be used as the gate dielectric for the organic transistor to improve the transconductance. Suitable insulating polymers include PMMA, polyimide or polyvinylphenol. A chemical-mechanical polish process can be carried out, if necessary, since the polymer is supported by a firm carrier. A pair of contacts 170 and 180 are formed using the similar method mentioned in FIGS. 5(a) and 5(b) for source and drain contacts, respectively.

Figure 7:
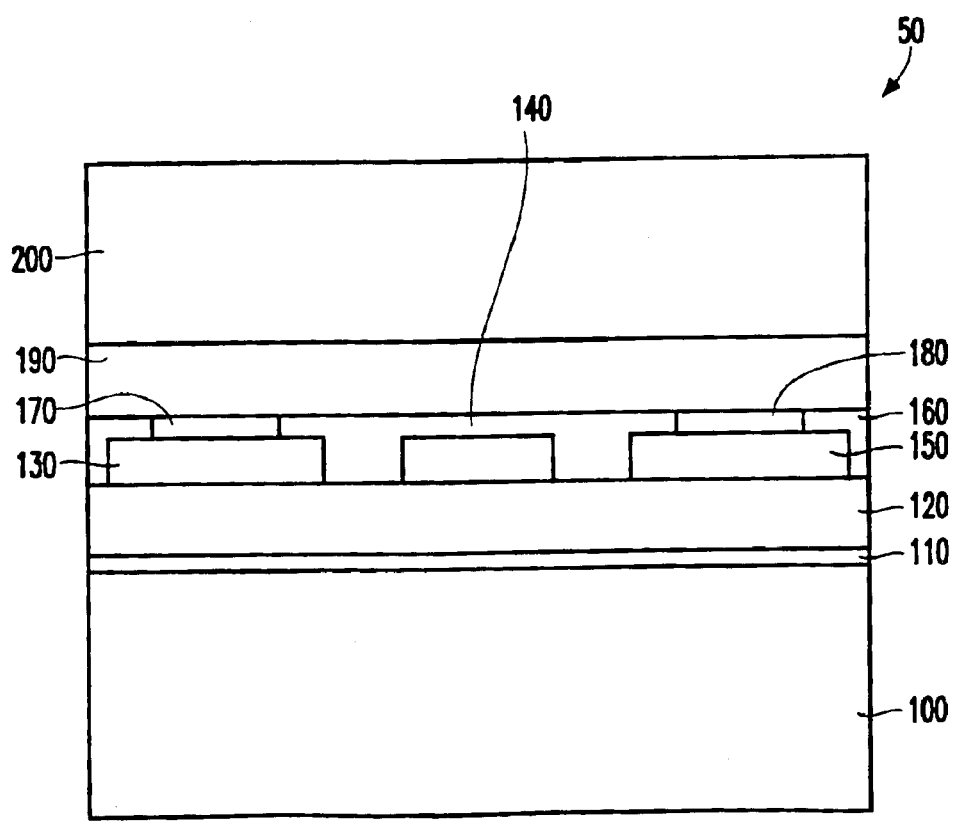
FIG. 7 is a side view schematic diagram of a partially completed thin-film transistor device according to the present invention.

In FIG. 7, a layer of semiconductive polymer or oligomer with a uniform thickness 190 is coated on top of the second insulating polymer layer 160 and contacts 170 and 180, and is immediately protected by a third layer of insulating polymer 200.

The semiconductive organic material is sensitive to contamination; therefore, the properties of the material will be degraded if not immediately covered with a layer of protective coating. Therefore, after the material 190 is coated, a thin polymer 200 is immediately deposited. The semiconductive organic material is prevented from being exposed by any chemical. A proper thermal treatment is carried out after the semiconductive organic material is covered by a thick insulating polymer. In most instances, the performance of the organic semiconductor is very sensitive to temperature. Organic semiconductors are not generally exposed to thermal treatment.

Figure 8:
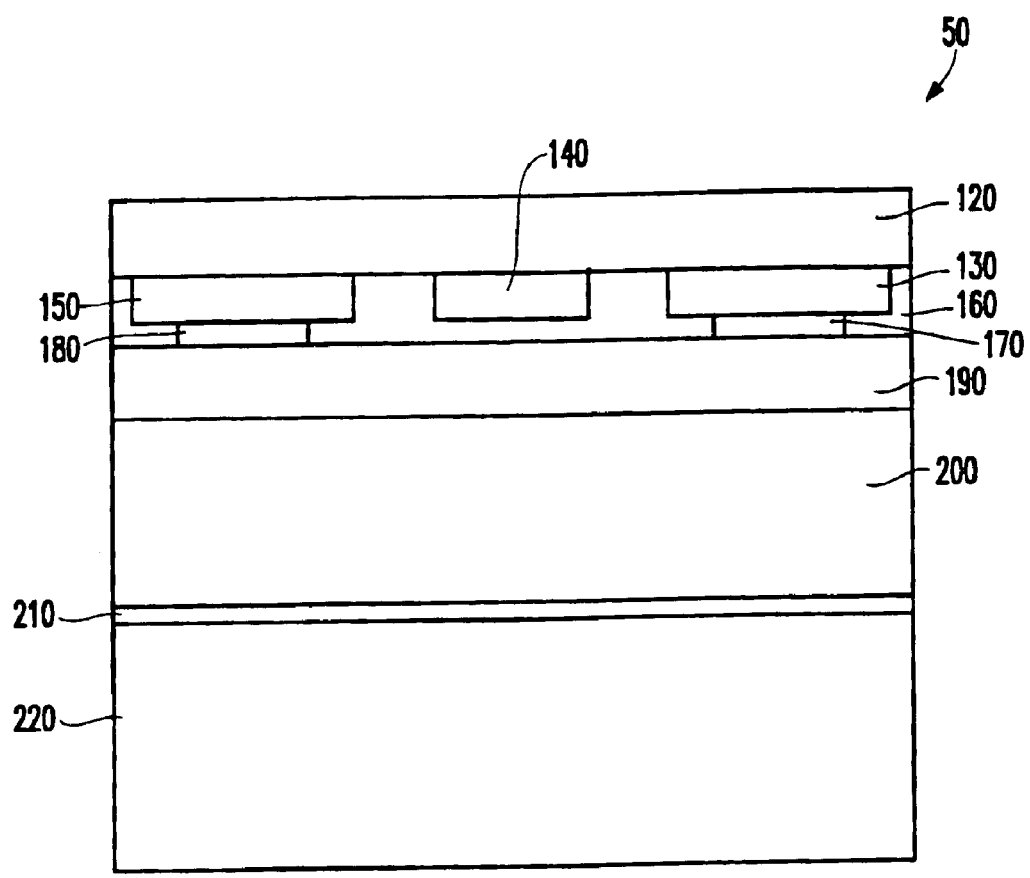
FIG. 8 is a side view schematic diagram of a partially completed thin-film transistor device according to the present invention.

Next, as detailed in FIG. 8, the composite 50 is flipped upside-down and then bonded to a second carrier layer 220 with a second precoated layer of wax 210 disposed therebetween. Simultaneously, the first carrier 100 and the first thin layer of wax 110 are removed.

Then, the composite 50 is etched, and patterned sections 230 emerge to define the whole transistor 50, which is illustrated in FIG. 9. The etching process etches through the protective layer 120, the contact polymer pads 130, 140, and 150, the high-k dielectric polymer 160, the semiconductive organic material 190, and stops at the polymer substrate 200. The etching can be accomplished in an oxygen plasma.

Then, as shown in FIG. 10, another insulating polymer 270 is coated on the composite 50 right after etching and fills the patterned sections 230. This can be done in-situ in the same reactor such that the semiconductive polymer 190 will not become contaminated (or poisoned). Contacts to the source 240, gate 250, and drain 260 are formed with a conductive material, polymer, or metal, followed by a chemical-mechanical polish.

Generally, FIG. 10 illustrates a completed fully planarized thin-film transistor device 50 comprising a carrier layer 220, a first insulating layer 200 over the carrier layer 220, a fully planarized contaminant-free semiconductor layer 190 over the first insulating layer 200, a second insulating layer 160 over the semiconductor layer 190, a third insulating layer 270 adjacent to sides of the semiconductor layer 190, and a plurality of conductive contacts 150/180, 130/170 connected to the semiconductor layer 190, wherein the first 200, second 160, and third 270 insulating layers each comprise one of a polyester and a polyimide material. In another embodiment, the first 200, second 160, and third 270 insulating layers each comprise a polycarbonate material. The thin-film transistor device 50 further comprises an adhesive layer 210 connected to the carrier layer 220, wherein the adhesive layer 210 comprises one of a photoresist and a photosensitive polyimide material. Additionally, the thin-film transistor device 50 further comprises source 240, drain 260, and gate 250 regions connected to the conductive contacts 150/180, 130/170, 140, respectively. Furthermore, the semiconductor layer 190 is adjacent to each of the first 200, second 160, and third 270 insulating layers, wherein the first 200, second 160, and third 270 insulating layers surround the semiconductor layer 190.

Figure 11:
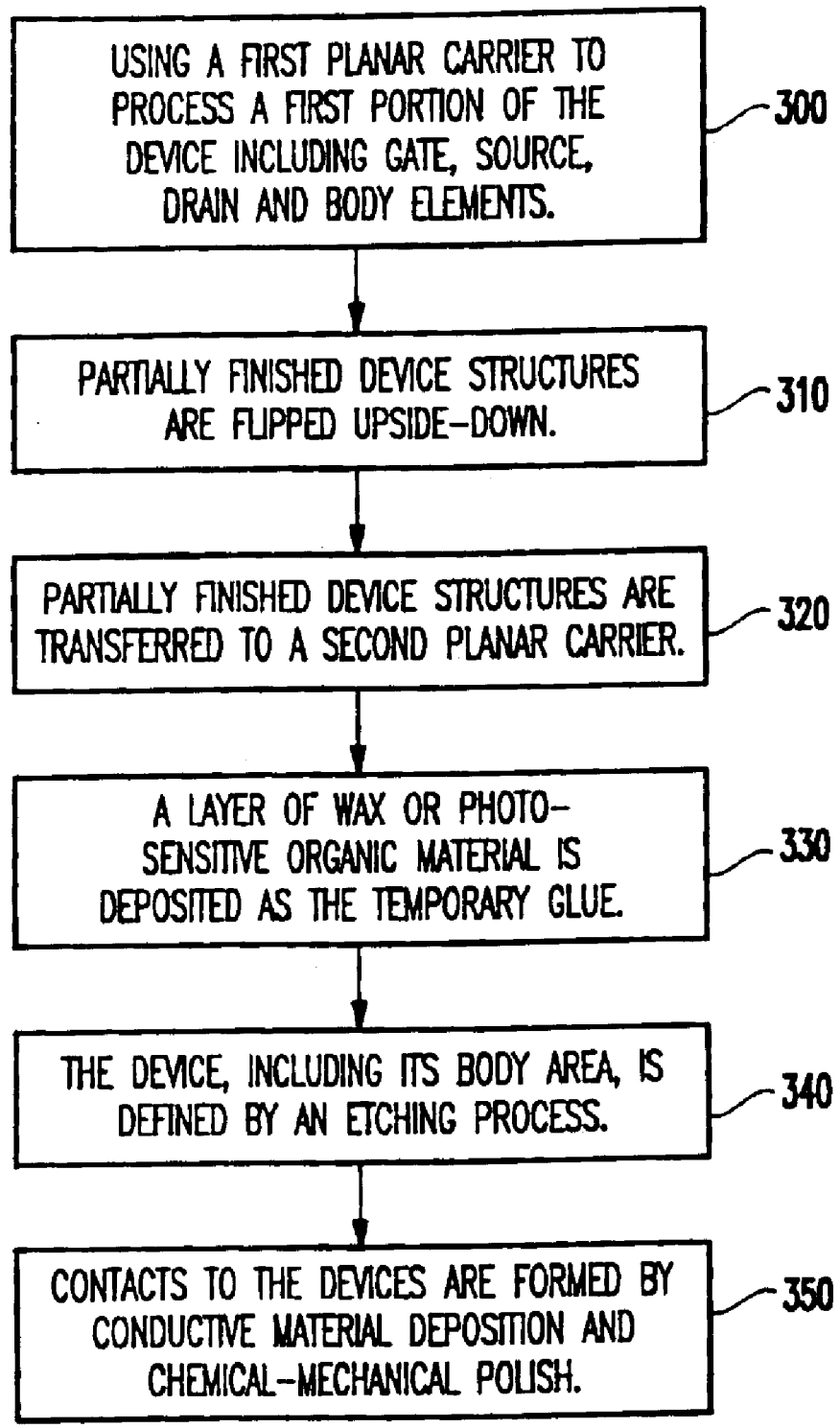
FIG. 11 is a flow diagram illustrating a preferred method of the invention.

The entire process of forming a fully planarized polymer thin-film transistor 50 is further shown in the flow diagram of FIG. 11. The process comprises using a first planar carrier 100 to process 300 a first portion of the device 50 including gate 140, source 150, and drain 130 body elements. Preferably, the thin-film transistor 50 is made with all organic material. The gate dielectric 160 can be a high-k polymer to boost the device performance. Then, the partially-finished device structures are flipped 310 upside-down and transferred 320 to a second planar carrier 200. Next, a layer 210 of wax or photo-sensitive organic material is deposited 330 as the temporary glue. The device 50, including its body area, is then defined 340 by an etching process. Contacts 240, 250, 260 to the devices are formed 350 by conductive material deposition and chemical-mechanical polish.

The novel features of the present invention are several. Broadly, the present invention provides for a high-performance transistor due to unique structural and process flow. Specifically, all functional components are preferably made of polymeric materials (semiconductive, conductive, low-k insulative, and high-k insulative materials). Furthermore, the carrier is preferably a wafer, glass carrier, or polymer, and can be rigid or flexible. However, the size is not limited by the wafer size and is adaptable to large format carriers. Also, the entire structure, including the semiconductor body, gate, source/drain, the interface between the body and the gate, and the drain/source are all fully planarized so that there is no electrical performance degradation due to the corner thinning between the semiconductor body and the source/drain region. Moreover, the structure is fabricated in a simple and cost-effective manner, which allows for the fabrication of both N-FET and P-FET transistors. Finally, the semiconductor body is planarized, and its interface with the source/drain and gate dielectric is fully protected from subsequent processing.

Furthermore, unlike conventional polymer thin-film transistors, the invention produces fully planarized devices so that there is no corner thinning problem. Another advantage of the new polymer device is that the most sensitive area of the device, the body, which is made of an organic semiconductor, is fully protected, before any processing steps, to avoid the possibility of being contaminated by the environment. Moreover, the organic semiconductor is fully enveloped by a plurality of insulator layers 200, 160, 270 so as to avoid contamination.

While the invention has been described in terms of preferred embodiments, those skilled in the art will recognize that the invention can be practiced with modification within the spirit and scope of the appended claims.

What is claimed is:

1. A thin-film transistor device comprising:
   a carrier layer;
   a first insulating layer over said carrier layer;
   a fully planarized semiconductor layer over said first insulating layer;
   a second insulating layer over said semiconductor layer;
   a third insulating layer adjacent to sides of said semiconductor layer;
   a plurality of conductive contacts connected to said semiconductor layer;
   source and drain regions connected to said conductive contacts; and
   a gate region connected to said conductive contacts, wherein said source, drain, and gate regions are co-planar.

2. The device of claim 1, wherein the first, second, and third insulating layers each comprise one of a polyester and a polyimide material.

3. The device of claim 1, wherein the first, second, and third insulating layers each comprise a polycarbonate material.

4. The device of claim 1, further comprising an adhesive layer connected to said carrier layer, wherein said adhesive layer comprises one of a photoresist and a photosensitive polyimide material.

5. The device of claim 4, wherein said thin-film transistor is fully planarized.

6. The device of claim 1, wherein said semiconductor layer is contaminant-free.

7. The device of claim 1, wherein said semiconductor layer is adjacent to each of the first, second, and third insulating layers, and wherein said first, second, and third insulating layers surround said semiconductor layer.

8. A fully planarized thin-film transistor device comprising:
- a carrier layer;
- a first insulating layer over said carrier layer;
- a contaminant-free semiconductor layer over said first insulating layer;
- a second insulator layer over said semiconductor layer;
- a third insulating layer adjacent to sides of said semiconductor layer;
- a plurality of conductive contacts connected to said semiconductor layer;
- source and drain regions connected to said conductive contacts; and
- a gate region connected to said conductive contacts;
- wherein said source, drain, and gate regions are co-planar, and
- wherein the first, second, and third insulating layers surround said semiconductor layer.

9. The device of claim 8, wherein the first, second, and third insulating layers each comprise one of a polyester and a polyimide material.

10. The device of claim 8, wherein the first, second, and third insulating layers each comprise a polycarbonate material.

11. The device of claim 8, further comprising an adhesive layer connected to said carrier layer, wherein said adhesive layer comprises one of a photoresist and a photosensitive polyimide material.

12. The device of claim 8, wherein said semiconductor layer is adjacent to each of said first, second, and third insulating layers.

13. A thin-film transistor device comprising:
- a substrate;
- a first insulating layer over said substrate;
- a fully planarized contaminant-free semiconductor layer over said first insulating layer;
- a second insulating layer over said semiconductor layer;
- a third insulating layer adjacent to sides of said semiconductor layer;
- a plurality of conductive contacts connected to said semiconductor layer;
- source and drain regions connected to said conductive contacts; and
- a gate region connected to said conductive contacts,
- wherein said source, drain, and gate regions are co-planar, and
- wherein said semiconductor layer is adjacent to each of the first, second, and third insulating layers.

14. The device of claim 13, wherein the first, second, and third insulating layers each comprise one of a polyester and a polyimide material.

15. The device of claim 13, wherein the first, second, and third insulating layers each comprise a polycarbonate material.

16. The device of claim 13, further comprising an adhesive layer connected to said carrier layer, wherein said adhesive layer comprises one of a photoresist and a photosensitive polyimide material.

17. The device of claim 13, wherein said thin-film transistor is fully planarized.

18. The device of claim 13, wherein the first, second, and third insulating layers surround said semiconductor layer.

* * * * *